United States Patent [19]
Maerfeld et al.

[11] Patent Number: 4,477,784
[45] Date of Patent: Oct. 16, 1984

[54] SURFACE WAVE DISPERSIVE ACOUSTIC DELAY LINE

[75] Inventors: Charles Maerfeld; Claude Lardat, both of Paris, France

[73] Assignee: Thomson-CSF, Paris, France

[21] Appl. No.: 424,614

[22] Filed: Sep. 27, 1982

[30] Foreign Application Priority Data

Jan. 15, 1982 [FR] France ............................. 82 00615

[51] Int. Cl.$^3$ ............................................. H03H 9/44
[52] U.S. Cl. ..................................... 333/153; 333/154; 310/313 D
[58] Field of Search .............................. 333/150–156, 333/193–196; 310/313 R, 313 A, 313 B, 313 C, 313 D

[56] References Cited

U.S. PATENT DOCUMENTS 3,975,697  8/1976  Paige .......................... 310/313 D X Primary Examiner—Marvin L. Nussbaum
Attorney, Agent, or Firm—Oblon, Fisher, Spivak, McClelland & Maier

[57] ABSTRACT

A dispersive acoustic delay line using reflection on slanted gratings is provided. This device comprises slanting input and output transducers each formed of pair electrode fingers. The interval of the electrodes of different polarity varying from $nv/2f_{min}$ to $nv/2f_{max}$, where v is the speed of the waves, $f_{min}$ and $f_{max}$ the endmost frequencies of the frequency band and n the number of the harmonic on which the transducers operate. The interval of the gratings varies from $kv/f_{min}$ to $kv/f_{max}$, where k is the number of the operating harmonic of the network, with $n \neq k$.

2 Claims, 9 Drawing Figures

FIG.3
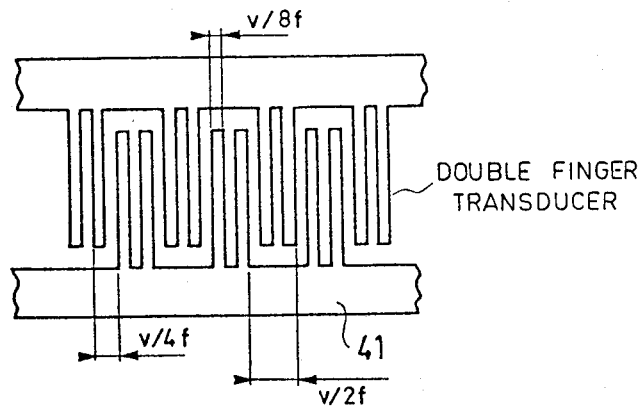
DOUBLE FINGER TRANSDUCER
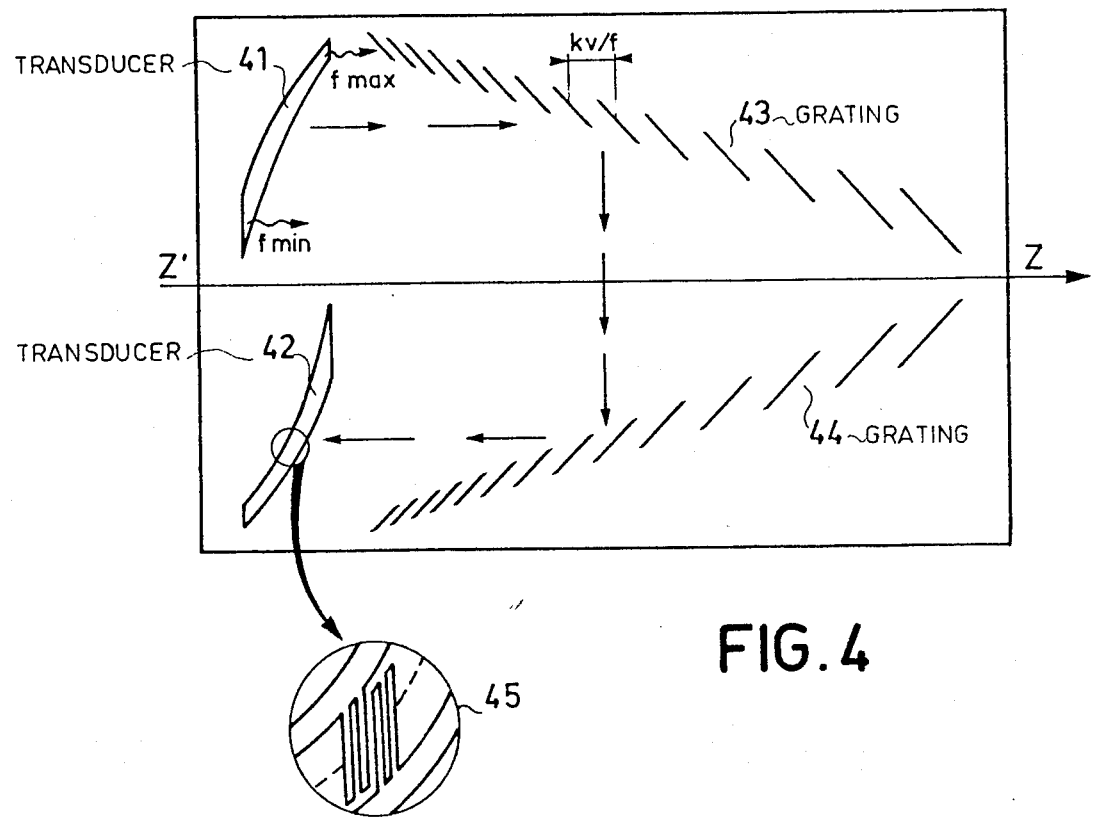
FIG.4

SURFACE WAVE DISPERSIVE ACOUSTIC DELAY LINE

BACKGROUND OF THE INVENTION

The present invention relates to dispersive delay lines using propagation of surface acoustic waves which are reflected on slanted gratings. These devices are known in Anglo-American literature under the name of "Slanted reflective array compressor", to which the shortened name of "SRAC" has been given, which will be used hereafter.

More particularly, the invention applies to devices with a relatively high band, more especially greater than 50%, and with a high central frequency, for example greater than 1000 MHz. It also applies to the more economical construction of dispersive filters with lower central frequency.

These SRAC devices are known more especially from an article by B. R. POTTER and C. S. HARTMANN in IEEE Transactions on Sonics and Ultrasonics-vol 26, November 1979, pp 411 to 418.

Such a device comprises input and output transducers each having series of interdigital fingers at variable intervals. The transducers and the two reflective gratings are disposed so that to each frequency of the band of the signal there corresponds an input-output path with reflection on the gratings, corresponding to the given dispersion law.

For such transducer devices, the smallest electrode width is equal to $$\frac{v}{4f_o + 2B},$$

if B is the band, $f_o$ the central frequency and v the speed of the waves. The values of $f_o$ and B are therefore limited by the feasibility of the transducers.

In fact, with even the most sophisticated conventional photolithographic techniques, it is difficult to go below 0.6 μm.

For example, for a frequency band of 1 GHz around 1.5 GHz, the smallest electrode width is equal to about 0.44 μm for a lithium niobate substrate and a propagation along the "Z" axis of the crystal. It is not possible to obtain lines of this width with conventional photolithography.

Moreover, it is known that some types of interdigital transducers are capable of being used at a harmonic frequency of the given frequency by the spacing apart and the width of the electrodes, which allows a higher central frequency to be obtained. This is more especially the case for multi-electrode type transducers. The geometry of these transducers is such that each electrode is divided into several electrodes of smaller width. With these multi-electrode type transducers the undesirable effects due to the reflections of a mechanical nature between the electrodes can generally be eliminated.

In addition, it is known that their frequency response allows them to be operated at different harmonic frequencies. In particular, in the case of a pair electrode transducer, the harmonic lines are of uneven rank and the third has substantially a level equal to that of the fundamental line. Such transducers are described in an article by T. W. BRISTOL et al., appearing in Ultrasonics Symposium Proceedings 1972, pp 343 to 345.

Furthermore, other types of transducers other than the dual electrode type, are capable of operating at different harmonic frequencies.

The disadvantage of transducers operating on harmonics, when the passband of the signal is large, is that the same frequency, corresponding to two different harmonics, may be transmitted by two different fingers.

The dispersive line of the invention remedies these disadvantages and allows high frequencies of the order of 1 GHz and a bandwidth greater than 50% to be obtained at one and the same time, and this with electrode widths obtainable by photolithographic procedures.

SUMMARY OF THE INVENTION

Briefly, it is a dispersive delay line using surface waves of speed v operating in a frequency band between the frequencies $f_{min}$ and $f_{max}$, comprising input and output transducers having variable interval interdigital electrodes, the accoustic waves being reflected on two variable interval slanted gratings, wherein the transducers are of the multi-electrode oblique alignment type in which the between electrodes of different polarity is between $(nv/2f_{min})$ and $(nv/2f_{max})$, n being an integer and that the two dispersive reflective gratings are slanted and that the distances between the corresponding reflectors are respectively between $(kv/f_{min})$ and $(kv/f_{max})$, k being another integer whose value is different from the value of n.

BRIEF DESCRIPTION OF THE DRAWINGS

Other characteristics and advantages will be clear from the following description, illustrated by the figures which show.

DESCRIPTION OF THE PREFERRED EMBODIMENTS

Figure 1:
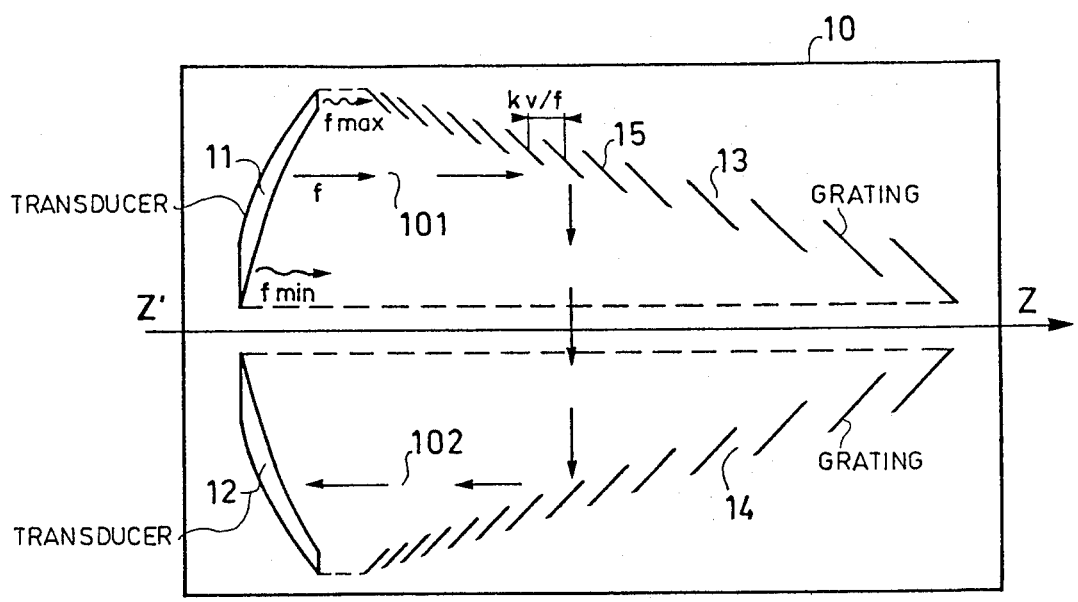
FIG. 1, the diagram of a slanted reflective grating dispersive line.

FIG. 1 gives the known diagram of an SRAC device. On a piezoelectric substrate 10 are disposed two input and output transducers 11 and 12, of an interdigital finger type, symmetrical with respect to the direction of propagation ZZ' of the surface waves. The line connecting the centers of the electrodes is slanted with respect to the direction ZZ'.

The two transducers define two propagation paths 101 and 102, across which are disposed two reflective gratings 13 and 14 symmetrical with respect to the axis ZZ'. These two gratings are formed from lines or grooves etched in the surface of the substrate.

Transducer 11 is energized by an input electric signal and transmits an acoustic signal in a frequency band between $f_{min}$ and $f_{max}$.

The signal corresponding to a frequency f is propagated along a path shown by arrows in FIG. 1. The position between the grating lines at location 15, where the signal of frequency f is reflected, is equal to k(v/f), k being the order, equal to 1, 2, 3 ... and v being the acoustic wave speed. The grooves are slanted with respect to the propagation direction by a predetermined angle, taking into account the anisotropy of the substrate, so that at the output of transducer 12 a selectively delayed signal is obtained depending on the frequency f. Referring to FIG. 1, it will be readily understood that to the minimum frequency $f_{min}$ there corresponds a greater delay than to the maximum frequency $f_{max}$ and such a device allows for example a linearly frequency-modulated input signal to be compressed in time.

Figure 2:
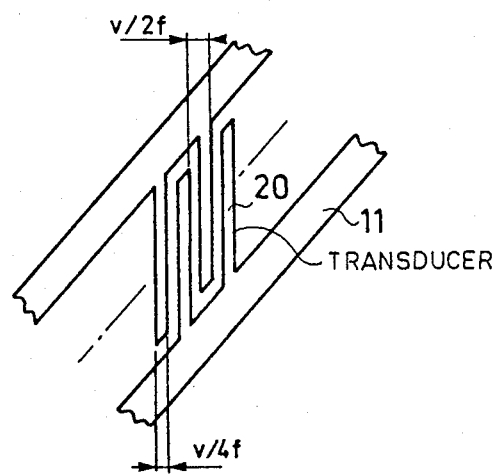
FIG. 2, the diagram of an interdigital finger transducer with single electrodes, FIG. 3, the diagram of an interdigital finger transducer with pair electrodes, FIG. 4, the diagram of a dispersive line in accordance with the invention, FIG. 5, an explanatory diagram showing a transducer and a grating, FIG. 6, the frequency ranges emitted for uneven harmonics, FIGS. 7, 8 and 9, explanatory drawings and diagrams of the device of the invention.

Generally, in this device, the input and output transducers 11 and 12 have a single electrode structure. This geometry is shown in FIG. 2. To transmit a signal of frequency f, electrodes 20 are spaced apart by a value v/2f and have a width equal to v/4f. So as to obtain a wide emission band between $f_{min}$ and $f_{max}$, the spacing between electrodes varies from one end to the other of the transducer between $v/2f_{min}$ and $v/2f_{max}$.

FIG. 4 shows an arrangement of the input and output transducers 41 and 42 in accordance with a variation of the invention. The slanted transducers 41 and 42 are disposed symmetrically with respect to a point on axis ZZ' so as to induce no dispersion due to the slope thereof with respect to the propagation axis. In this figure are shown the reflective gratings 43 and 44 with variable spacing kv/f.

According to the invention, transducers 41 and 42 have a multi-electrode structure. In this type of transducer, each electrode is divided into several electrodes of equal length and constant interval. The interval between two consecutive electrodes of different polarity being always equal to v/2f. If each electrode is divided in two, a pair electrode structure is obtained, shown in FIG. 3 and the enlarged part 45 of transducer 42 of FIG. 4. The electrodes are at spacing v/4f and have a width of v/8f.

Figure 5:
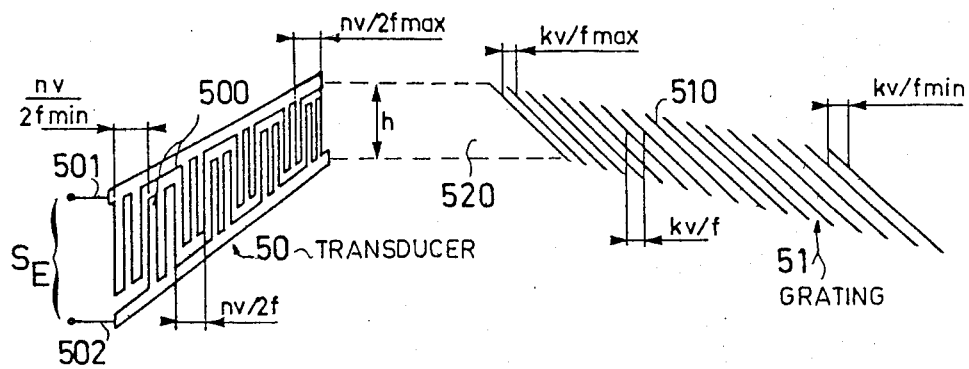

In the preferred embodiment shown in FIG. 5, the invention consists in combining a pair electrode transducer 50 in which the spacing between consecutive electrodes 500 of different polarity varies between $nv/2f_{min}$ and $nv/2f_{max}$, $f_{min}$ and $f_{max}$ being the endmost frequencies of the operating band, with a reflective grating 51, in which the spacing between lines 510 at the same frequency f is equal to kv/f, n and k being integers whose respective values are chosen different.

For example, by energizing the transducer on harmonic 3, i.e. n=3, the interval between consecutive electrodes of different polarity of the input and output transducers varies from $(3v/2f_{min})$ to $(3v/2f_{max})$.

By choosing the fourth order of reflection, i.e. k=4, the lines of the two reflective gratings vary from $(4v/f_{min})$ to $(4v/f_{max})$.

With single electrode transducers, for a frequency f, the interval between electrodes is equal to v/2f whereas their width is equal to v/4f. In the case of pair electrode transducers, the interval between consecutive electrodes becomes (nv/4f) whereas their width becomes (nv/8f) and for n=3, for example, the width of the electrodes is 50% greater. Thus, for frequency values $f_{min}$ and $f_{max}$ which, according to the prior art, would lead to a construction of the interdigital input and output transducers which is impossible by known photolithographic processes, the invention allows this construction. Conversely, for the same frequency, the invention allows a more economical construction.

The important advantage of the invention is the possibility of operating with a relative wide band, even if there is overlapping of the harmonic frequency bands. This property is due to the fact that the transducers and the gratings do not operate on the same harmonic frequency.

It may be considered that the input and output transducers are formed of several "elementary" transducers, formed of a group of electrodes each of which transmits (or receives) a frequency f in an elementary band df. There is a space-frequency correspondence between the height of the emission point of the waves and frequency f. It should be noted that the energy transmitted in the form of acoustic waves at a frequency f is propagated over the height h of the electrodes, which defines a propagation path such as 520.

Figure 6:
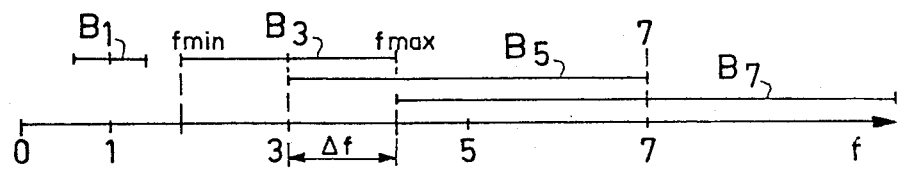

To give an idea, let us consider that the input signal $S_E$, applied to terminals 501 and 502 of the transducer, is such that its relative band is large, for example 80%. FIG. 6 shows on a frequency scale the bandwidths of a transducer for different orders. It is assumed that the transducer is designed for operation with harmonic 3. Band $B_3$ centered on f=3 corresponds to the operating band going from values $f_{min}$ to $f_{max}$.

There are also shown bands $B_1$, $B_5$ and $B_7$, centered at 1, 5 and 7 corresponding to operation of the transducer at harmonics 1, 5 and 7. An overlapping of bands $B_3$ and $B_5$ shown in FIG. 6 will be noted. Considering that the transducer is of the pair electrode type, it will be understood that, according to the previous teaching, the same elementary transducer corresponding to frequency f which belongs to the overlap range $\Delta f$, will transmit two waves at two different frequencies, their values being in the ratio of 5/3. For the example chosen, it so happens that the lower end of $B_5$ falls to f=3.

Figure 7:
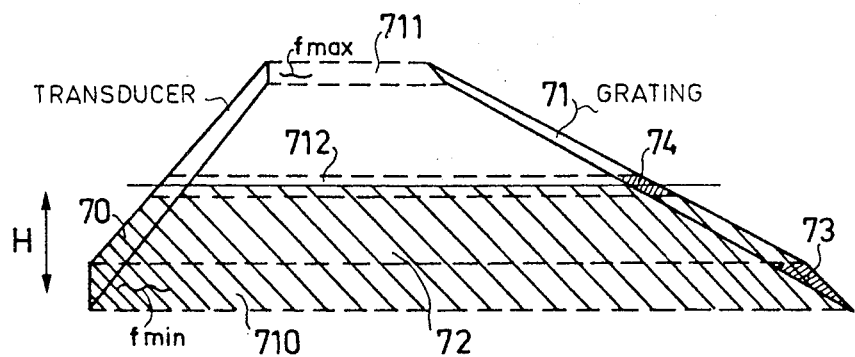

The input transducer 70 and reflective grating 71 are shown schematically in FIG. 7. The propagation path 710 corresponds to the minimum frequency whereas the propagation path 711 corresponds to the maximum frequency. The hatched part 72 corresponds to overlapping of the two harmonic frequency bands 3 and 5 and two waves are propagated therein at two different frequencies in the ratio 5/3. Thus, in path 710 the waves at frequency $f_{min}$ and $5/3f_{min}$ are propagated simultaneously. The part of the grating 73 must not then be adapted to reflect the frequency $5/3f_{min}$, otherwise the same delay would correspond to two different frequencies.

Furthermore, two frequencies of the same value are propagated in two spatially differentiated paths. Thus, frequency $f_{max}$ is propagated in the propagation path 711 and in path 712. Part 74 of the grating must then not be matched to reflect frequency $f_{max}$, otherwise two different delays would correspond to two equal frequencies.

According to the invention, so as to obtain the two previously mentioned conditions, the harmonic rank n is chosen different from the order k.

Figure 8:
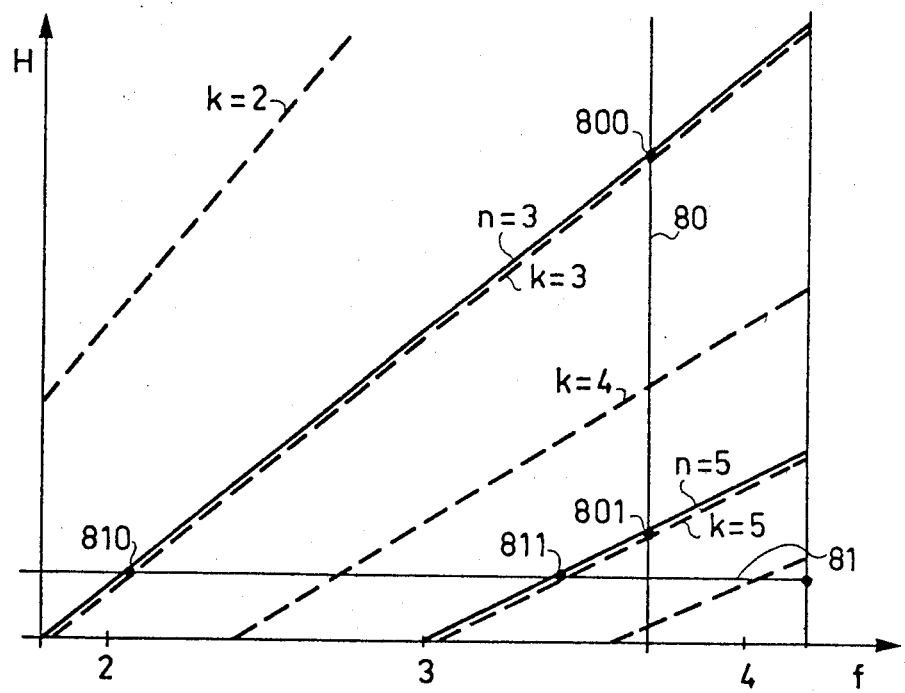
Figure 9:
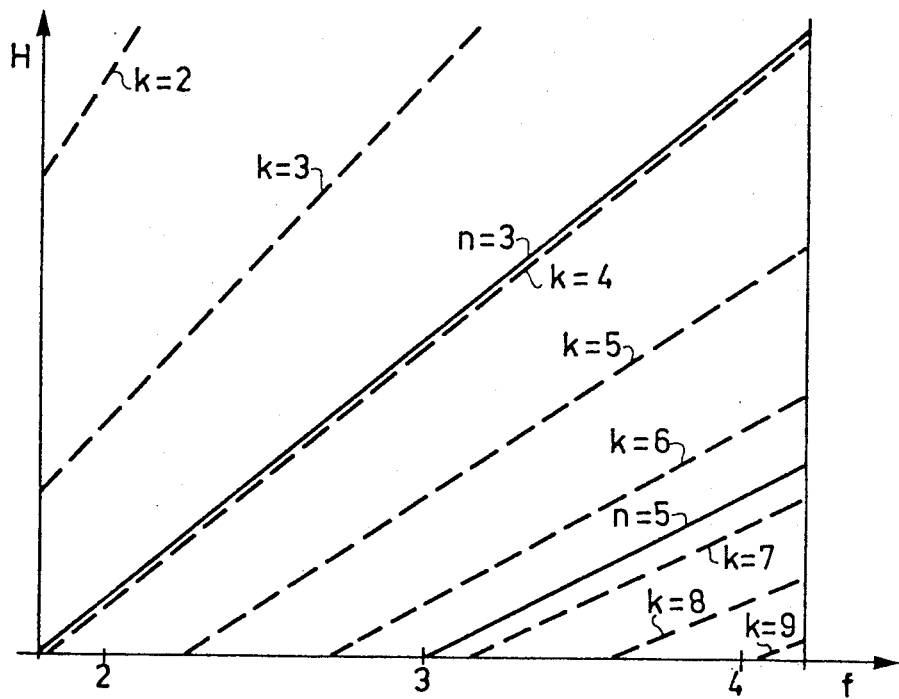

In FIGS. 8 and 9, there are shown gratings of straight lines in the space-frequency range, the space, identified by the height H, being shown as ordinates and the frequency as abscissa.

The continuous straight lines refer to the signal transmitted or received by the transducer for different values of n, whereas the dotted straight lines refer to the reflective grating for different values of k. The two frequency limits correspond to a relative band of 80%.

In FIG. 8, the values of n and k chosen are equal to 3. The straight lines corresponding to n=3 and k=3 are therefore superimposed and would provide correct operation, if there were not another superimposition, obtained for n=5 and k=5, values of n and k which also appear in the band, so that there may be two locations which are matched to the same frequency, as shown by the intersection points 800 and 801 with the vertical straight line 80 or else two different frequencies, which are matched to the same location as shown by the points of intersection 810 and 811 with the horizontal straight line 81.

In FIG. 9, the values of n and k chosen are equal respectively to 3 and 4. It can be seen that the straight lines corresponding to the signal are not superimposed on the straight lines corresponding to the reflective grating, except of course for n=3 and k=4.

One embodiment of the invention gives the following characteristics:
material LiNbO3
propagation speed=v=3400m/sec
minimum frequency of the signal=$f_{min}$=1 GHz
maximum frequency of the signal=$f_{max}$=2 GHz
harmonic used for the transducers=n=3
harmonic used for the gratings=k=1
maximum difference between delays=T=1 μsec
product BT=1000
spacing and width of the electrodes of the transducers for $$f_{max} = \frac{nv}{8f_{max}} = 0.65 \ \mu m$$

spacing and width of the electrodes of the transducers for $f_{min}$=1.3 μm
spacing of the grating for $f_{max}$=kv/$f_{max}$=1.73 μm
spacing of the grating for $f_{min}$=kv/$f_{min}$=3.46 μm To conclude, with the device of the invention dispersive delay lines may be obtained having relative wide bands and for high frequencies. These performances are important for pulse compression and analog Fourier transform circuits.

What is claimed is:

1. A surface acoustic wave device for dispersing surface waves of a speed v operating in a frequency band of $f_{min}$ and $f_{max}$ comprising:
   a substrate for supporting surface acoustic waves;
   an input transducer means of the multi-electrode oblique alignment type having variable interval interdigital electrodes for producing acoustic waves;
   an output transducer of the multi-electrode oblique alignment type having variable interval interdigital electrodes mounted so that the slope of said input and said output transducers are equal and are disposed symmetrically about a point on the Z'—Z axis of said substrate for receiving said acoustic waves; and
   two variable interval slating grating means for reflecting said acoustic waves and,
   wherein the interval between said interdigital electrodes of said input and output transducers is between (nv/2$f_{min}$) and (nv/2$f_{max}$) with n being an integer, and the two dispersive reflective gratings are slanted and the distance between said corresponding reflectors are respectively between (kv/$f_{min}$) and (kv/$f_{max}$) with k being another integer whose value is different from said value of n.

2. The delay line as claimed in claim 1, wherein said input and output transducers are of the dual electrode type.

* * * * *